United States Patent
Venugopal et al.

(10) Patent No.: US 11,139,803 B1
(45) Date of Patent: Oct. 5, 2021

(54) LOW POWER FLIP-FLOP WITH BALANCED CLOCK-TO-Q DELAY

(71) Applicant: Apple Inc., Cupertino, CA (US)

(72) Inventors: Vivekanandan Venugopal, San Jose, CA (US); Ajay Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/030,163

(22) Filed: Sep. 23, 2020

(51) Int. Cl.
   *H03K 3/037* (2006.01)
   *H03K 5/135* (2006.01)
   *H03K 3/0233* (2006.01)
   *H03K 3/3562* (2006.01)
   *H03K 3/289* (2006.01)

(52) U.S. Cl.
   CPC ....... *H03K 3/0372* (2013.01); *H03K 3/02332* (2013.01); *H03K 3/289* (2013.01); *H03K 3/3562* (2013.01); *H03K 5/135* (2013.01)

(58) Field of Classification Search
   CPC ...... H03K 3/0372; H03K 5/135; H03K 3/037; H03K 3/02332; H03K 3/289; H03K 3/3562; H03K 3/0233; H03K 3/286; H03K 3/35625
   See application file for complete search history.

(56) References Cited

U.S. PATENT DOCUMENTS

| | | | |
|---|---|---|---|
| 6,445,210 B2 | 9/2002 | Nojiri | |
| 9,059,687 B2 | 6/2015 | Ramaraju et al. | |
| 9,425,775 B2* | 8/2016 | Jarrar | H03K 3/0372 |
| 9,948,303 B2 | 4/2018 | Narayanan et al. | |
| 10,033,356 B2 | 7/2018 | Wang et al. | |
| 10,115,450 B1 | 10/2018 | DeBrosse et al. | |
| 11,005,459 B1 | 5/2021 | Hess et al. | |
| 2007/0223289 A1 | 9/2007 | Lee | |
| 2009/0015321 A1 | 1/2009 | Hamdan et al. | |
| 2009/0052246 A1 | 2/2009 | Bertin et al. | |
| 2012/0182056 A1 | 7/2012 | Dally et al. | |
| 2014/0210516 A1 | 7/2014 | Hwang et al. | |
| 2015/0279451 A1 | 10/2015 | Jung et al. | |
| 2016/0146887 A1 | 5/2016 | Lou et al. | |

* cited by examiner

*Primary Examiner* — Jung Kim
(74) *Attorney, Agent, or Firm* — Rory D. Rankin; Kowert, Hood, Munyon, Rankin & Goetzel, P.C.

(57) ABSTRACT

Systems, apparatuses, and methods for implementing low-power flip-flops with balanced clock-to-Q delay are described. A flip-flop includes a primary latch, an upper secondary latch, and a lower secondary latch. The primary latch transmits a data value from an input port to a first node when transparent. The upper secondary latch pulls up a second node when transparent and when the first node is equal to a first value. The second node is a prebuffered data output of the flip-flop. The lower secondary latch pulls down the second node when transparent and when the first node is equal to a second value different from the first value. To ensure the flip-flop has a balanced clock-to-Q delay, a first set of clock signals coupled to transistor gates of the primary latch are delayed with respect to a second set of clock signals coupled to transistor gates of the upper secondary latch.

20 Claims, 11 Drawing Sheets

900

905
Receive an Input Signal on Gates of a P-Type Transistor and an N-Type Transistor of a First Stack of a Primary Latch of a Flip-Flop with a Balanced Clock-to-Q Delay

910
Receive a Double-Inverted Clock Signal on a Gate of a P-Type Transistor of a First Stack of the Primary Latch

915
Receive a Triple-Inverted Clock Signal on a Gate of an N-Type Transistor of the First Stack of the Primary Latch

920
Receive the Triple-Inverted Clock Signal on a Gate of a P-Type Transistor of a Second Stack of the Primary Latch

925
Receive a Double-Inverted Clock Signal on a Gate of an N-Type Transistor of the Second Stack of the Primary Latch

930
Receive, by an Inverter, a Signal Generated at a Mid-Point of the First and Second Stacks of the Primary Latch

935
Receive, by a Upper Secondary Latch and a Lower Secondary Latch, the Output of the Inverter

FIG. 9

LOW POWER FLIP-FLOP WITH BALANCED CLOCK-TO-Q DELAY

BACKGROUND

Technical Field

Embodiments described herein relate to the field of circuits and, more particularly, to implementing a low power flip-flop with a balanced clock-to-Q delay.

Description of the Related Art

Digital electronic systems utilize a number of different types of synchronous circuits for controlling the movement of information. Sequential elements are used for storing and driving data in a variety of circuits such as general-purpose central processing unit (CPU), data parallel processors like graphics processing units (GPUs), digital signal processors (DSPs), and so forth. Modern processors are typically pipelined. For example, the processors include one or more data processing stages connected in series with sequential elements placed between the stages for storing and driving the data. The output of one stage is made the input of the next stage during each transition of a clock signal. The sequential elements typically are flip-flop circuits.

Flip-flops are commonly used and implemented in a wide variety of systems and circuits. A flip-flop circuit includes one or more data inputs, a clock input, and one or more data outputs. Logic signals may be received on the data input(s) of a flip-flop circuit. Responsive to an edge (e.g., a rising edge) of the clock signal, the logic values of these signals may be captured and stored in the flip-flop circuit, with these values being stored until another synchronizing edge (e.g., the next rising edge) is received. Between these edges, the flip-flop circuit stores the captured logic value.

There is typically a large variation for a flip-flop between the clock-to-Q delay for a rising edge and the clock-to-Q delay for a falling edge. This can have a negative effect on the circuits that are using the signals passed through flip-flops. For example, a flip-flop can be used to create a divide-by-2 clock-divider circuit by connecting the inverted output (or Qn) back to the input of the flip-flop. However, the variation between the clock-to-Q delay for falling and rising edges results in a clock output that has an unbalanced duty cycle. In other words, the unbalanced duty cycle of the clock output generated by a typical flip-flop-based clock divider is not within a particular threshold of a 50% duty cycle. Also, the difference between the clock-to-Q delay rise and the clock-to-Q delay fall tends to increase as the voltage decreases, causing the flip-flop to become more unbalanced, and creating problems for downstream consumers of the flip-flop output.

SUMMARY

Systems, apparatuses, and methods for implementing low power flip-flops with balanced clock-to-Q delay are contemplated. In one embodiment, a flip-flop circuit includes a primary latch coupled to an upper secondary latch and a lower secondary latch, with the upper secondary latch and lower secondary latch arranged in parallel. The primary latch transmits a data value from an input port to a first node when transparent. The upper secondary latch pulls up a second node when transparent and when the first node is equal to a first value. The second node is a prebuffered data output of the flip-flop. The lower secondary latch pulls down the second node when transparent and when the first node is equal to a second value different from the first value. The second node is coupled to a data output port of the flip-flop via a pair of inverters. To ensure the flip-flop has a balanced clock-to-Q delay for rising and falling edges, a first set of clock signals are coupled to transistor gates of the primary latch and the lower secondary latch, a second set of clock signals are coupled to transistor gates of the upper secondary latch, and the first set of clock signals are delayed with respect to the second set of clock signals.

In one embodiment, the flip-flop circuit also includes an inverter chain which receives a clock signal and generates a single-inverted clock signal, double-inverted clock signal, triple-inverted clock signal, and so on. The number of inverters in the inverter chain varies according to the embodiment. In one embodiment, a first stack of the upper secondary latch receives a single-inverted clock signal on a gate of a P-type transistor and a double-inverted clock signal on a gate of an N-type transistor. A second stack of the upper secondary latch receives the double-inverted clock signal on a gate of a P-type transistor and the single-inverted clock signal on a gate of an N-type transistor. A first stack of the lower secondary latch receives a triple-inverted clock signal on a gate of a P-type transistor and the double-inverted clock signal on a gate of an N-type transistor. A second stack of the lower secondary latch receives the double-inverted clock signal on a gate of a P-type transistor and the triple-inverted clock signal on a gate of an N-type transistor. After the two stacks, the signal path of the upper secondary latch includes two inverters before reconverging with the lower secondary latch signal path. The lower secondary latch includes a single inverter in the signal path before the signal path reconverges with the upper secondary latch. The structure of the flip-flop and the relative delays associated with the clock signals coupled to the various gates of the upper secondary latch and lower secondary latch helps to reduce the disparity between the rising edge clock-to-Q delay and falling edge clock-to-Q delay. This in turn helps to balance the duty cycle of a clock generated by a clock divider constructed using this flip-flop structure. This balanced duty cycle is achieved by closely matching the clock-to-Q delay for the input clock rising edge and the input clock falling edge.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which:

FIG. 9 is a flow diagram of one embodiment of a method for implementing a low-power balanced clock-to-Q delay flip-flop.

Figure 1:
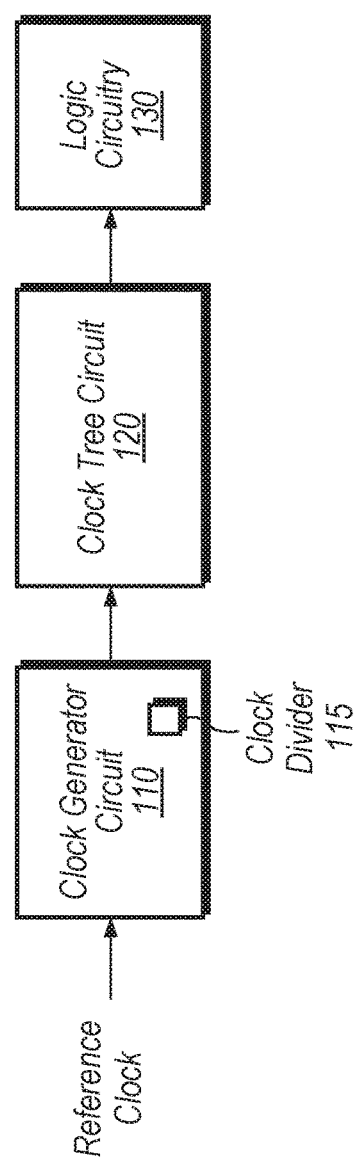
FIG. 1 is a generalized block diagram of one embodiment of an integrated circuit.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

The present disclosure includes references to "an" "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Referring to FIG. 1, a block diagram of one embodiment of an integrated circuit (IC) 100 is shown. In one embodiment, IC 100 includes clock generator circuit 110, clock tree circuit 120, and logic circuitry 130. In some embodiments, the components of IC 100 may actually be located in two or more separate IC's. Additionally, it should be understood that IC 100 may also include any number of other components (e.g., voltage regulator(s), memory device(s), processing unit(s)) which are not shown to avoid obscuring the figure.

Clock generator circuit 110 receives a reference clock and generates an output clock that is conveyed to clock tree circuit 120. In one embodiment, clock generator circuit 110 includes a clock divider 115 which is implemented using a flip-flop with a balanced clock-to-Q delay. Using a flip-flop with a balanced clock-to-Q delay results in the output clock having a balanced duty cycle (i.e., relatively close to a 50% duty cycle). Examples of different ways of implementing clock divider 115 to generate a divided clock with a balanced duty cycle are described in further below for clock divider 500 (of FIG. 5) and clock divider 600 (of FIG. 6).

Clock tree circuit 120 provides any number of clock signals derived from the received clock to logic circuitry 130. The clock tree circuit 120 may generally include the circuitry configured to receive a source clock and distribute the clock to multiple clock sinks, with an attempt to match the delay and load to each sink to minimize the difference in time at which the clock arrives (e.g., skew and jitter). The clock sinks may be various clocked storage devices and other clocked elements in logic circuitry 130. Thus, while the clock tree circuit 120 is shown in between the clock generator circuit 110 and the logic circuitry 130, the clock tree circuit 120 may generally be distributed over the area occupied by the logic circuitry 130, and may deliver the clock to multiple physically distributed points within the area.

The logic circuitry 130 may include any combinatorial logic and clocked storage circuits such as latches, flops, registers, memory arrays, and so on. The clocks provided by the clock tree circuit 120 may be received by the clocked storage circuits and/or any other circuitry that may use a clock (e.g., dynamic logic circuitry). Each connection point to the clock tree circuit 120 may be a clock sink.

Figure 2:
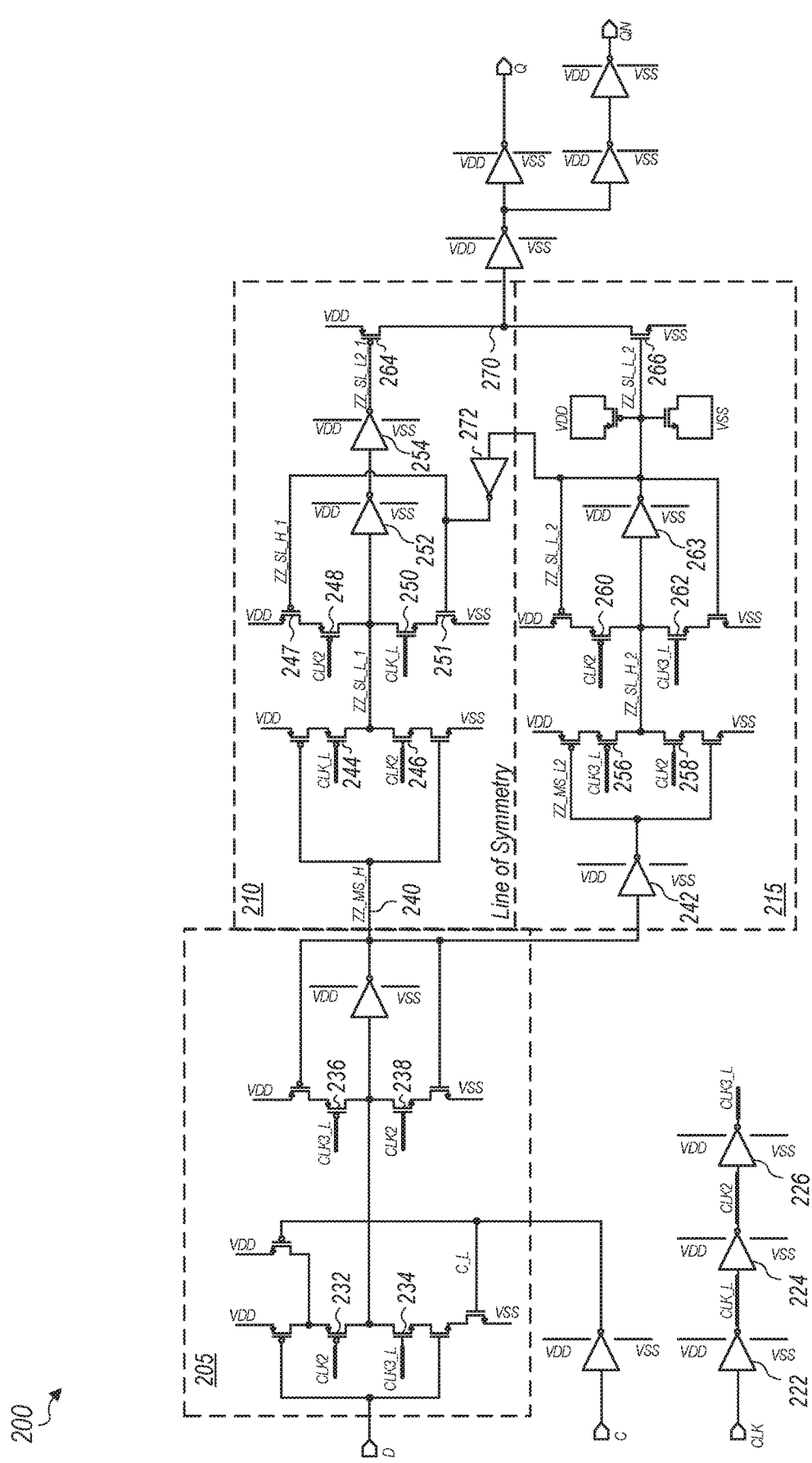
FIG. 2 is a circuit diagram illustrating one embodiment of a flip-flop with a balanced clock-to-Q delay.

Turning now to FIG. 2, a circuit diagram of one embodiment of a flip-flop 200 with a balanced clock-to-Q delay is shown. In one embodiment, flip-flop 200 includes primary latch portion 205, upper secondary latch portion 210, and lower secondary latch portion 215, as well as other circuit components. The clock signal received by flip-flop 200 goes through a chain of inverters 222, 224, and 226. In other embodiments, the chain of inverters may include other numbers of inverters. The single-inverted clock "CLK_L" is generated by the first inverter 222 in the chain, the double-inverted clock "CLK2" is generated by the second inverter 224 in the chain, and the triple-inverted clock "CLK3_L" is generated by the third inverter 226 in the chain. It is noted that the terms "single-inverted", "double-inverted", and "triple-inverted" may be used interchangeably herein with the terms "single-buffered", "double-buffered", and "triple-buffered", respectively. Using these different delayed versions of the clock within flip-flop 200 helps to create an output signal that has a balanced clock-to-Q delay for rising and falling edges. In other words, having a balanced clock-to-Q delay means that the clock-to-Q delay for an output rising edge is within a threshold amount of the clock-to-Q delay for an output falling edge.

It should be understood that the example of using the single-inverted clock "CLK_L", the double-inverted clock "CLK2", and the triple-inverted clock "CLK3_L" in the manner shown in flip-flop 200 is merely illustrative of one particular embodiment. In other embodiments, other delayed or inverted versions of clocks may be coupled to the various transistors to create a similar implementation of a flip-flop. In some cases, a different flip-flop may be implemented than what is shown for flip-flop 200 by using clock signals that have the same relation to each other as is shown for flip-flop 200. For example, in another embodiment, a triple-inverted clock could be used in place of the single-inverted clock "CLK_L", a quadruple-inverted clock could be used in place of the double-inverted clock "CLK2", and a quintuple-inverted clock could be used in place of the triple-inverted clock "CLK3_L". This would maintain the relative timing of the clock signals coupled to the gates of the various transistors in the same manner as flip-flop 200. Other embodiments could use other inverted versions of clock signals that have the same timing relative to other clock signals as is shown for flip-flop 200.

Primary latch portion 205 includes a first transistor stack with P-type transistor 232 and N-type transistor 234 as well as four other transistors. The input signal "D" is coupled to the gates of two outer transistors of the first transistor stack, and an optional clear signal "C" is inverted and then coupled to the gates of two outer transistors of the first transistor stack. P-type transistor 232 receives the double-inverted clock on its gate and N-type transistor 234 receives the triple-inverted clock on its gate. Primary latch portion 205 also includes a second transistor stack with P-type transistor 236 and N-type transistor 238 as well as two other outer transistors. P-type transistor 236 receives the triple-inverted clock on its gate and N-type transistor 238 receives the double-inverted clock on its gate. The drain of P-type transistor 236 and the drain of N-type transistor 238 are tied to an input of an inverter, with the output of the inverter labeled as "ZZ_MS_H" and coupled to the upper secondary latch 210 and lower secondary latch 215. It is noted that "ZZ_MS_H" may also be referred to as node 240.

The first transistor stack of upper secondary latch 210 includes P-type transistor 244 and N-type transistor 246 as well as two other transistors which receive the ZZ_MS_H signal on their gates. The single-inverted clock is coupled to the gate of P-type transistor 244 and the double-inverted clock is coupled to the gate of N-type transistor 246. Upper secondary latch 210 also includes a second transistor stack which includes P-type transistors 247 and 248 and N-type transistors 250 and 251. The double-inverted clock is coupled to the gate of P-type transistor 248 and the single-inverted clock is coupled to the gate of N-type transistor 250. The drains of P-type transistor 248, N-type transistor 250, P-type transistor 244, and N-type transistor 246 are tied together (labeled "ZZ_SL_L_1") and coupled to the input of inverter 252. The output of inverter 252 is coupled to the input of inverter 254, and the output of inverter 254 is coupled to the gate of P-type transistor 264. The drain of P-type transistor 264 is coupled to the drain of N-type transistor 266 at node 270 where the signal paths of upper secondary latch 210 and lower secondary latch 215 reconverge. It is noted that node 270 may also be referred to as the prebuffered data output of flip-flop 200. Two inverters are included on the path from node 270 to the output signal or "Q" of flip-flop 200, while three inverters are included on the path from node 270 to the output signal or "QN" of flip-flop 200.

Lower secondary latch 215 includes inverter 242 in the signal path prior to the first transistor stack of lower secondary latch 215. The first transistor stack of lower secondary latch 215 includes P-type transistor 256 and N-type transistor 258. The first transistor stack also includes two other transistors which receive the inverted ZZ_MS_H signal (i.e., ZZ_MS_L2) on their gates. The triple-inverted clock is coupled to the gate of P-type transistor 256 and the double-inverted clock is coupled to the gate of N-type transistor 258. Lower secondary latch 215 also includes a second transistor stack which includes P-type transistor 260 and N-type transistor 262 as well as two other transistors. The double-inverted clock is coupled to the gate of P-type transistor 260 and the triple-inverted clock is coupled to the gate of N-type transistor 262. The drains of P-type transistor 256, N-type transistor 258, P-type transistor 260, and N-type transistor 262 are tied together (labeled "ZZ_SL_H_2") and coupled to the input of inverter 263. The output of inverter 263 is coupled to the gate of P-type transistor 266.

Also, the output of inverter 263 is coupled to the input of inverter 272. The output of inverter 272 is coupled to the signal "ZZ_SL_H_1" which is connected to the gates of P-type transistor 247 and N-type transistor 251 in upper secondary latch 210. Inverter 272 is included in flip-flop 200 to prevent a crowbar current from flowing through P-type transistor 264 and N-type transistor 266 at power-up. During power-up, the clock input is typically equal to 0, and the two latches 210 and 215 may be powered up to contain two opposite values. If latches 210 and 215 hold opposite values, this causes both P-type transistor 264 and N-type transistor 266 to be on at the same time. The connection between lower secondary latch 215 and upper secondary latch 210 through inverter 272 prevents this crowbar current from flowing during power-up by ensuring the gates of P-type transistor 264 and N-type transistor 266 are at the same state. In another embodiment, inverter 272 is omitted, but a reset mechanism is incorporated into latches 210 and 215 to ensure they are holding the same value on power-up to avoid the crowbar current. In other embodiments, other techniques for preventing the crowbar current are possible and are contemplated.

It is noted that, in various embodiments, a "transistor" can correspond to one or more transconductance elements such as a metal-oxide-semiconductor field-effect transistor (MOSFET), a junction field-effect transistor (JFET), a bipolar transistor, or others. For example, in one embodiment, each P-type transistor is a P-type metal-oxide-semiconductor field-effect transistor (MOSFET) and each n-type transistor is an n-type MOSFET. In other embodiments, the P-type transistors and N-type transistors shown in the circuits herein can be implemented using other types of transistors. It is also noted that the terms N-type and P-type can be used interchangeably with N-channel and P-channel, respectively. Although single devices are depicted in the circuit diagrams of this disclosure, in other embodiments, multiple devices may be used in parallel to form any of the above devices.

Figure 3:
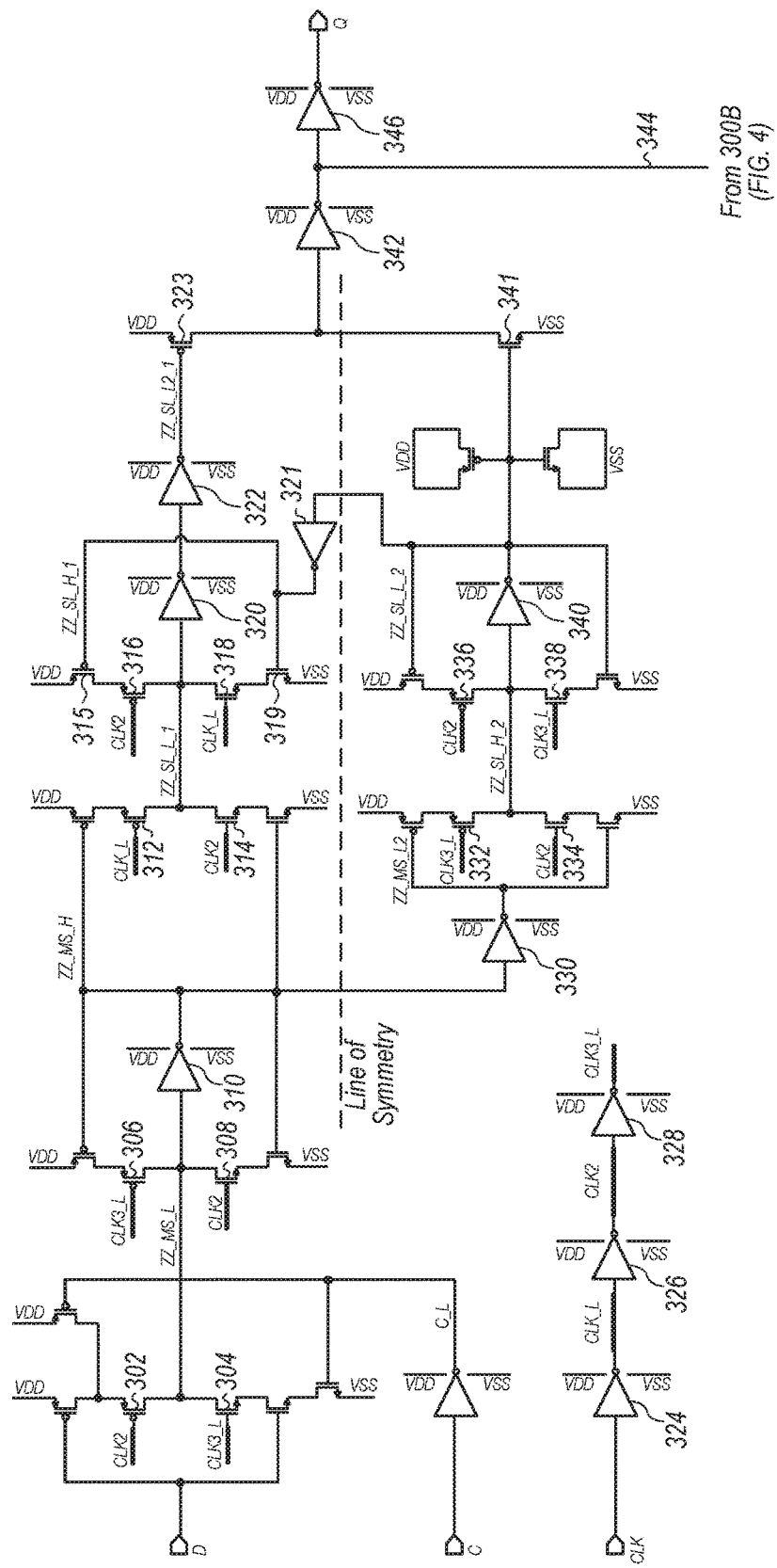
FIG. 3 is a circuit diagram of one embodiment of a first sub-circuit of another version of a flip-flop with a balanced clock-to-Q delay.

Referring now to FIG. 3, a circuit diagram of one embodiment of a first sub-circuit 300A of another version of a flip-flop with a balanced clock-to-Q delay is shown. In one embodiment, sub-circuit 300A is combined with sub-circuit 300B (of FIG. 4) to create a single flip-flop with a balanced clock-to-Q delay. As shown in FIG. 3, the input signal "D" is coupled to the primary latch of sub-circuit 300A. A clear signal "C" is also optionally coupled to transistors of the first stack of the primary latch via an inverter. In other embodiments, the clear signal "C" may be omitted. A clock signal is received by sub-circuit 300A and coupled to the inverter chain which includes inverters 324, 326, and 328. The output of inverter 324 is a single-inverted clock (or "CLK_L"), the output of inverter 326 is a double-inverted clock (or "CLK2"), and the output of inverter 328 is a triple-inverted clock (or "CLK3_L").

P-type transistor 302 and N-type transistor 304 are included in the first transistor stack of the primary latch. A double-inverted clock (or "CLK2") is coupled to the gate of P-type transistor 302, and a triple-inverted clock (or "CLK3_L") is coupled to the gate of N-type transistor 304. The "D" input signal is coupled to the gates of two other transistors of the first transistor stack. The primary latch also includes a second transistor stack that includes P-type transistor 306 receiving the triple-inverted clock on its gate, N-type transistor 308 receiving the double-inverted clock on its gate, and two other transistors. The drains of P-type transistor 306 and N-type transistor 308 are coupled to the drains of P-type transistor 302 and N-type transistor 304. This point is also labeled as "ZZ_MS_L" which is coupled to the input of inverter 310. The output of inverter 310 is coupled to both the upper secondary latch and the lower secondary latch.

The upper secondary latch includes a first transistor stack with P-type transistor 312, N-type transistor 314, and two other transistors. The single-inverted clock (or "CLK_L") is coupled to the gate of P-type transistor 312 and the double-inverted clock (or "CLK2") is coupled to the gate of N-type transistor 314. The upper secondary latch also includes a second transistor stack with P-type transistors 315 and 316 and N-type transistors 318 and 319. The double-inverted clock is coupled to the gate of P-type transistor 316 and the single-inverted clock is coupled to the gate of N-type transistor 318. The drains of P-type transistor 312, N-type transistor 314, P-type transistor 316, and N-type transistor 318 are coupled together and to the input of inverter 320. The output of inverter 320 is coupled to the input of inverter 322, and the output of inverter 322 is coupled to the gate of a P-type transistor. The drain of the P-type transistor is coupled to a drain of an N-type transistor from the lower secondary latch, where the upper secondary latch and lower secondary latch reconverge into the input of inverter 342. The output of inverter 342 is coupled to the input of inverter 346, with the output of inverter 346 the "Q" output of the flip-flop. Node 344 from sub-circuit 300B of the flip-flop is also coupled to the input of inverter 346.

The output of inverter 310 is also coupled to the input of inverter 330 of the lower secondary latch. The output of inverter 330, which is labeled "ZZ_MS_L2", is coupled to the gates of a P-type transistor and N-type transistor of the first transistor stack of the lower secondary latch. The first transistor stack also includes P-type transistor 332 and N-type transistor 334. The triple-inverted clock is coupled to the gate of P-type transistor 332 and the double-inverted clock is coupled to the gate of N-type transistor 334. The lower secondary latch also includes a second transistor stack of four transistors including P-type transistor 336 and N-type transistor 338. The double-inverted clock is coupled to the gate of P-type transistor 336 and the triple-inverted clock is coupled to the gate of N-type transistor 338. The drains of P-type transistor 332, N-type transistor 334, P-type transistor 336, and N-type transistor 338 are coupled together and to the input of inverter 340. This connection is labeled ZZ_SL_H_2. The output of inverter 340 is coupled to N-type transistor 341 which has its drain coupled to the drain of P-type transistor 323 from the upper secondary latch, allowing the output of the lower secondary latch to reconverge with the output of the upper secondary latch.

Also, the output of inverter 340 is coupled to the input of inverter 321. The output of inverter 321 is coupled to the signal "ZZ_SL_H_1" which is connected to the gates of P-type transistor 315 and N-type transistor 319 in the upper secondary latch. Inverter 321 is included in sub-circuit 300A to prevent a crowbar current from flowing at power-up through P-type transistor 323 and N-type transistor 341. During power-up, the clock input is typically equal to 0, and the upper secondary latch and lower secondary latch of sub-circuit 300A may be powered up to contain two opposite values. In this case, this causes both P-type transistor 323 and N-type transistor 341 to be on at the same time. The connection between the lower secondary latch and the upper secondary latch through inverter 321 prevents this crowbar current from flowing during power-up. In another embodiment, inverter 321 is omitted, but a reset mechanism is incorporated into the upper secondary latch and the lower secondary latch of sub-circuit 300A to ensure they are at the appropriate states on power-up to avoid the crowbar current.

Figure 4:
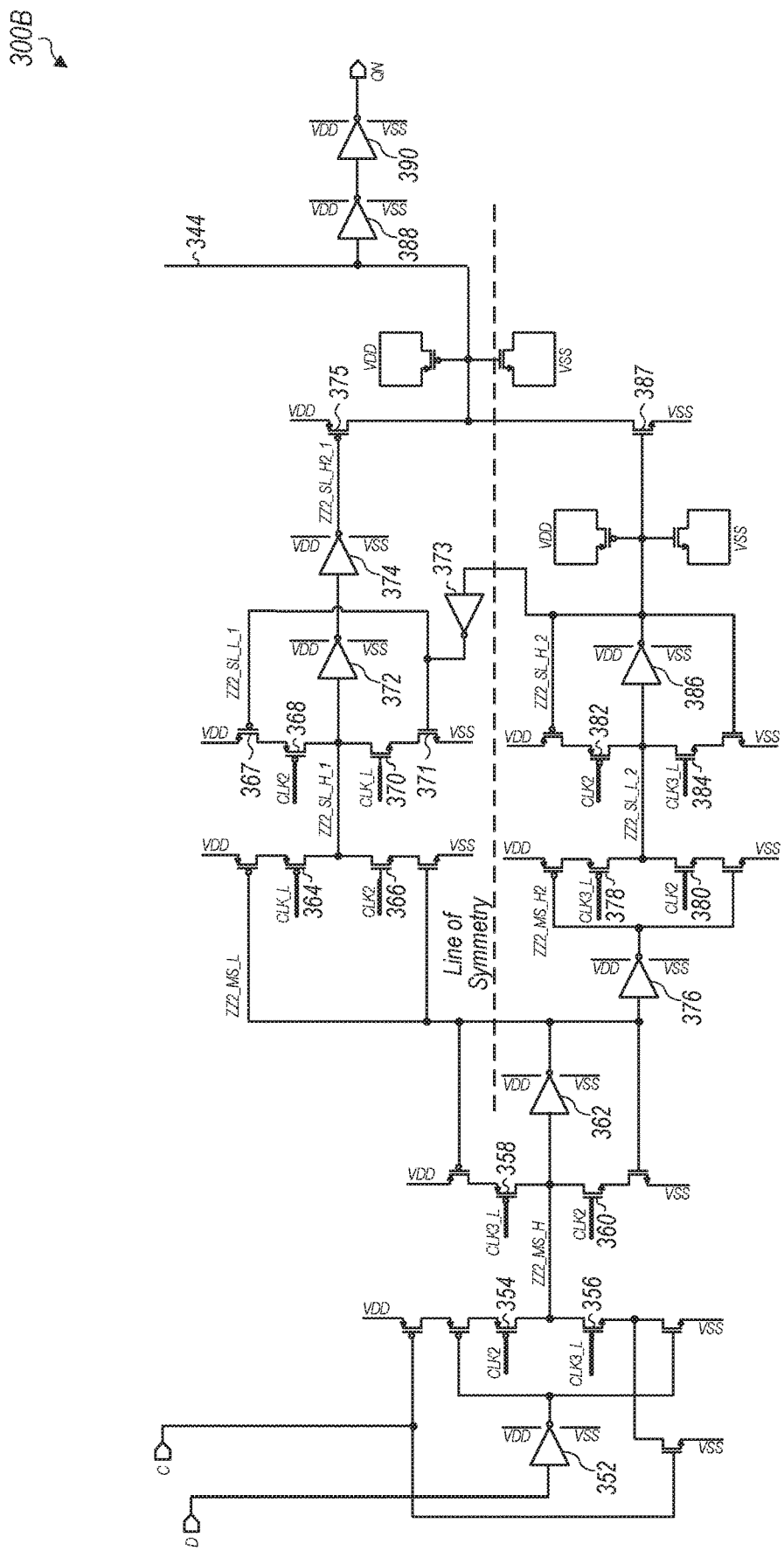
FIG. 4 is a circuit diagram of one embodiment of a second sub-circuit of another version of a flip-flop with a balanced clock-to-Q delay.

Turning now to FIG. 4, a circuit diagram of one embodiment of a second sub-circuit 300B of another version of a flip-flop with a balanced clock-to-Q delay is shown. In one embodiment, sub-circuit 300B is combined with sub-circuit 300A (of FIG. 3) to create a single flip-flop with a balanced clock-to-Q delay. As shown in FIG. 4, the input signal "D" is coupled to the inverter 352 of primary latch of sub-circuit 300B. The output of inverter 352 is coupled to the gates of a P-type transistor and an N-type transistor in a first transistor stack of the primary latch. The clear signal "C" is also optionally coupled to gates of the other transistors of the first transistor stack of the primary latch.

P-type transistor 354 and N-type transistor 356 are included in the first transistor stack of the primary latch. A double-inverted clock (or "CLK2") is coupled to the gate of P-type transistor 354, and a triple-inverted clock (or "CLK3_L") is coupled to the gate of N-type transistor 356. The primary latch also includes a second transistor stack that includes P-type transistor 358 receiving the triple-inverted clock on its gate, N-type transistor 360 receiving the double-inverted clock on its gate, and two other transistors. The drains of P-type transistor 358 and N-type transistor 360 are coupled together and to the drains of P-type transistor 354 and N-type transistor 356. This connection point, which is labeled as "ZZ2_MS_H", is also coupled to the input of inverter 362. The output of inverter 362 is coupled to both the upper secondary latch and the lower secondary latch, with the output of inverter 362 labeled as "ZZ2_MS_L".

The upper secondary latch includes a first transistor stack with P-type transistor 364 and N-type transistor 366 and two other transistors. The single-inverted clock (or "CLK_L") is coupled to the gate of P-type transistor 364 and the double-inverted clock (or "CLK2") is coupled to the gate of N-type transistor 366. The upper secondary latch also includes a second transistor stack with P-type transistors 367 and 368 and N-type transistors 370 and 371. The double-inverted clock is coupled to the gate of P-type transistor 368 and the single-inverted clock is coupled to the gate of N-type transistor 370. The drains of P-type transistor 364, N-type transistor 366, P-type transistor 368, and N-type transistor 370 are coupled together and to the input of inverter 372. The output of inverter 372 is coupled to the input of inverter 374, and the output (i.e., signal "ZZ2_SL_H2_1") of inverter 374 is coupled to the gate of P-type transistor 375. The drain of P-type transistor 375 is coupled to a drain of N-type transistor 387 from the lower secondary latch, where the upper secondary latch and lower secondary latch reconverge as node 344 into the input of inverter 388. The output of inverter 388 is coupled to the input of inverter 390, with the output of inverter 390 the inverted output (or "QN") of the flip-flop. Node 344 is also coupled to the input of inverter 346 (of FIG. 3).

The output of inverter 362 is also coupled to the input of inverter 376 of the lower secondary latch. The output of inverter 376, which is labeled "ZZ2_MS_H2", is coupled to the gates of a P-type transistor and N-type transistor of the first transistor stack of the lower secondary latch. The first transistor stack of the lower secondary latch also includes P-type transistor 378 and N-type transistor 380. The triple-inverted clock is coupled to the gate of P-type transistor 378 and the double-inverted clock is coupled to the gate of N-type transistor 380. The lower secondary latch also includes a second transistor stack of four transistors including P-type transistor 382 and N-type transistor 384. The double-inverted clock is coupled to the gate of P-type transistor 382 and the triple-inverted clock is coupled to the gate of N-type transistor 384. The drains of P-type transistor 378, N-type transistor 380, P-type transistor 382, and N-type transistor 384 are coupled together and to the input of inverter 386. This connection is labeled ZZ2_SL_L_2. The output of inverter 386 is coupled to N-type transistor 387 which has its drain coupled to the drain of P-type transistor 375 from the upper secondary latch, allowing the output of the lower secondary latch to reconverge with the output of the upper secondary latch.

Also, the output of inverter 386 is coupled to the input of inverter 373. The output of inverter 373 is coupled to the signal "ZZ2_SL_L_1" which is connected to the gates of P-type transistor 367 and N-type transistor 371 in the upper secondary latch. Inverter 373 is included in sub-circuit 300B to prevent a crowbar current from flowing at power-up through P-type transistor 375 and N-type transistor 387. During power-up, the clock input is typically equal to 0, and the upper secondary latch and lower secondary latch of sub-circuit 300B may be powered up to contain two opposite values. In this case, this causes both P-type transistor 375 and N-type transistor 387 to be on at the same time. The connection between the lower secondary latch and the upper secondary latch of sub-circuit 300B through inverter 373 prevents this crowbar current from flowing during power-up. In another embodiment, inverter 373 is omitted, but a reset mechanism is incorporated into the upper secondary latch and the lower secondary latch of sub-circuit 300B to ensure they are at the appropriate states on power-up to avoid the crowbar current.

Figure 5:
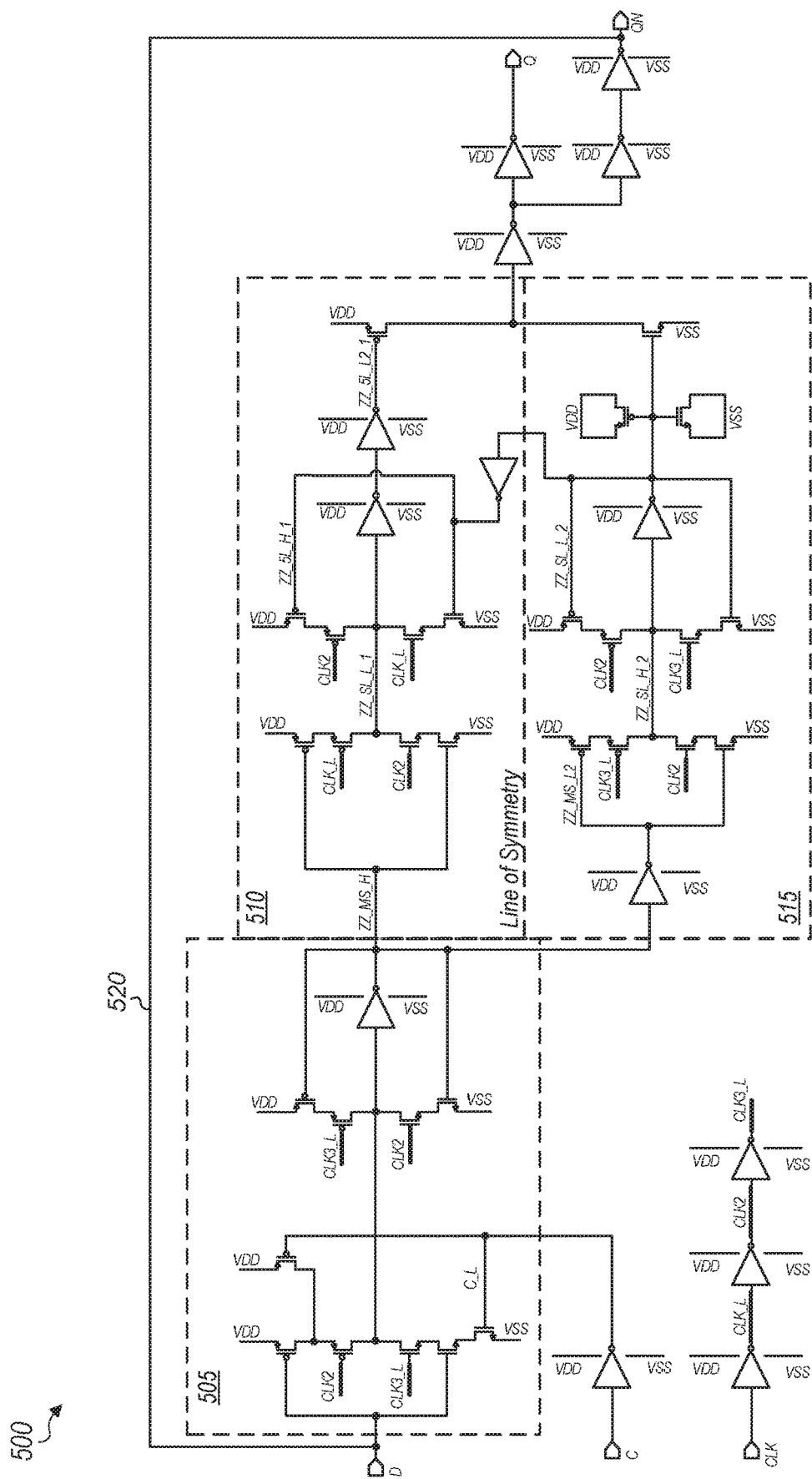
FIG. 5 is a circuit diagram of one embodiment of a low power balanced clock divider.

Referring now to FIG. 5, a circuit diagram of one embodiment of a low power balanced clock divider 500 is shown. In one embodiment, clock divider 500 includes the same circuit components, circuit structure, and signal connections as the flip-flop 200 (of FIG. 2). An additional connection for clock divider 500 which was not present in flip-flop 200 is the connection 520 from the QN output back to the D input. This enables clock divider 500 to function as a divide-by-2 clock divider. Clock divider 500 includes primary latch portion 505, upper secondary latch portion 510, and lower secondary latch portion 515 which are the equivalents of primary latch portion 205, upper secondary latch portion 210, and lower secondary latch portion 215, respectively, of flip-flop 200. As a result of implementing clock divider 500 using the components of flip-flop 200 having a balanced clock-to-Q delay, the clock output of clock divider 500 will have a balanced duty cycle. It is noted that in other embodiments, multiple instances of flip-flop 200 can be chained together to create other type of clock dividers (e.g., divide-by-4 clock divider).

Figure 6:
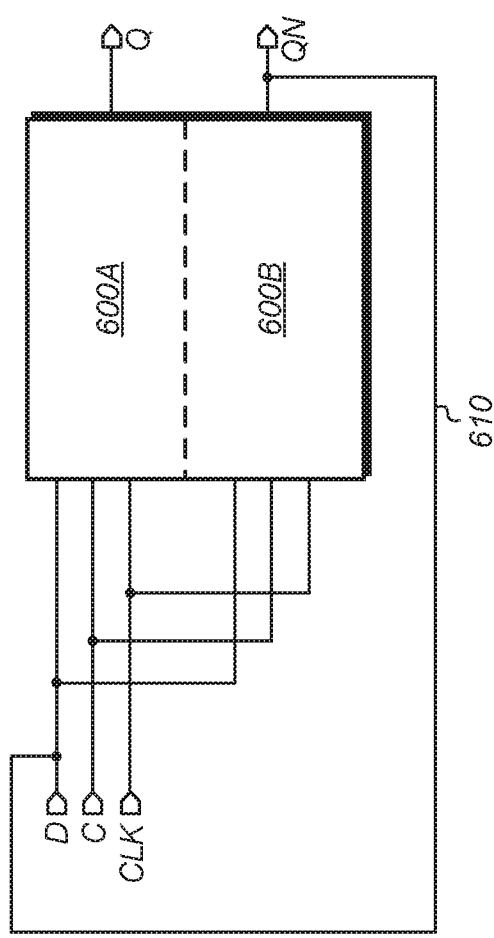
FIG. 6 is a circuit diagram of one embodiment of another version of a low power balanced clock divider.

Turning now to FIG. 6, a block diagram of one embodiment of another version of a low power balanced clock divider 600 is shown. In one embodiment, clock divider 600 includes sub-circuit 600A and sub-circuit 600B. In one embodiment, sub-circuit 600A includes the same components, structure, and connections as sub-circuit 300A (of FIG. 3) and sub-circuit 600B includes the same components, structure, and connections as sub-circuit 300B (of FIG. 4). Similar to clock divider 500 (of FIG. 5), there is a connection 610 from the QN output back to the D input of clock divider 600 which causes clock divider 500 to function as a divide-by-2 clock divider. As a result of implementing clock divider 600 using the components of flip-flop sub-circuits 300A-B which have a balanced clock-to-Q delay, the divided clock output of clock divider 600 will have a balanced duty cycle.

Figure 7:
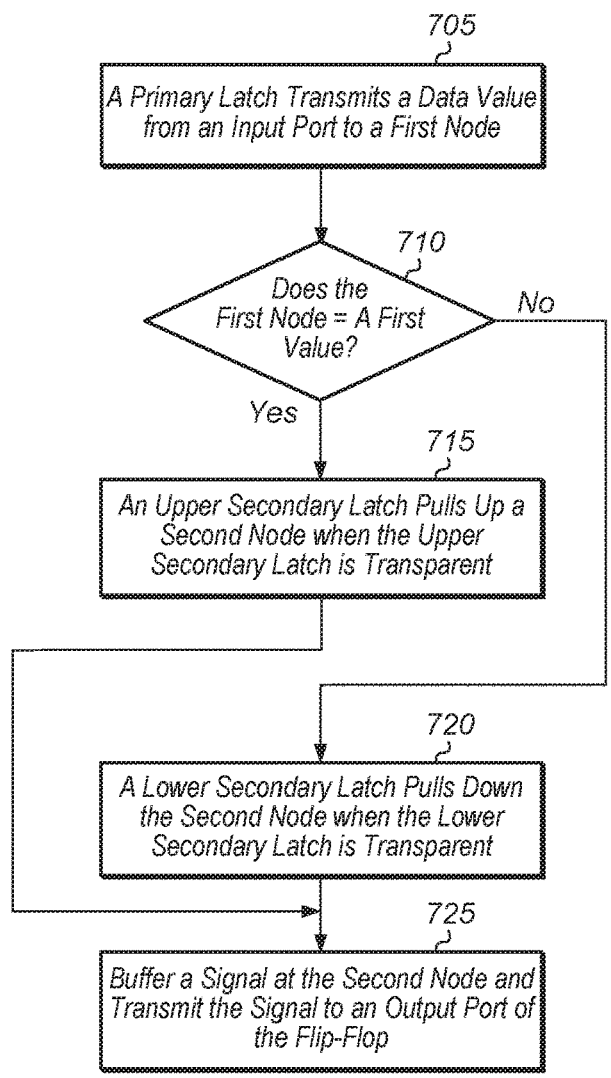
FIG. 7 is a flow diagram of one embodiment of a method for implementing a low-power balanced clock-to-Q delay flip-flop.

Referring now to FIG. 7, a generalized flow diagram of one embodiment of a method 700 for implementing a low-power balanced clock-to-Q delay flip-flop is shown. For purposes of discussion, the steps in this embodiment (and of FIGS. 8-9) are shown in sequential order. However, in other embodiments some steps may occur in a different order than shown, some steps may be performed concurrently, some steps may be combined with other steps, and some steps may be absent.

A primary latch of a flip-flop transmits a data value from an input port to a first node (e.g., node 240 of FIG. 2) when transparent (block 705). As used herein, a latch is defined as being "transparent" when the latch is in the active state (i.e., when the latch is enabled). When a latch is "transparent", a value present at an input to the latch is propagated through (with some delay) to an output of the latch.

If the first node is equal to a first value (conditional block 710, "yes" leg), then an upper secondary latch, when transparent, pulls up a second node (e.g., node 270 of FIG. 2) (block 715). In one embodiment, the first value is 1 (or VDD). Otherwise, if the first node is equal to a second value (conditional block 710, "no" leg), then a lower secondary latch, when transparent, pulls down the second node (block 720). In one embodiment, the second value is 0 (or VSS). After blocks 715 and 720, a signal at the second node is buffered and transmitted to an output port of the flip-flop (block 725). After block 725, method 700 ends. It is noted that the "upper secondary latch" and "lower secondary latch" may also be referred to herein as the "first secondary latch" and "second secondary latch", respectively.

Figure 8:
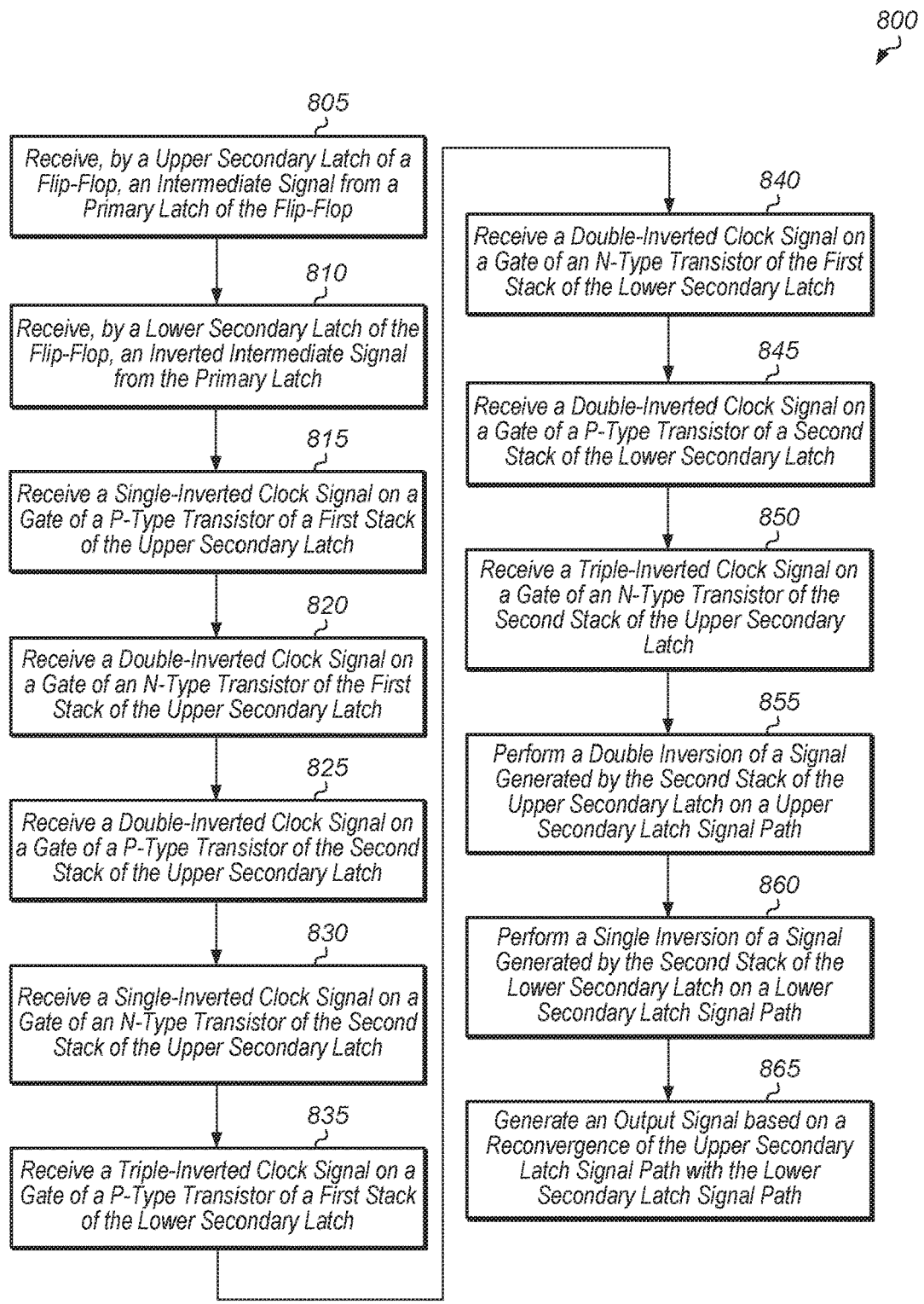
FIG. 8 is a flow diagram of one embodiment of a method for implementing a low-power balanced clock-to-Q delay flip-flop.

Turning now to FIG. 8, a generalized flow diagram of one embodiment of a method 800 for implementing a low-power balanced clock-to-Q delay flip-flop is shown. An upper secondary latch of a flip-flop receives an intermediate signal from a primary latch of the flip-flop (block 805). A lower secondary latch of the flip-flop receives an inverted intermediate signal from the primary latch (block 810). A single-inverted clock signal is received on a gate of a P-type transistor of a first stack of the upper secondary latch (block 815). A double-inverted clock signal is received on a gate of an N-type transistor of the first stack of the upper secondary latch (block 820). The double-inverted clock signal is also received on a gate of a P-type transistor of a second stack of the upper secondary latch (block 825). The single-inverted clock is also received on a gate of an N-type transistor of the second stack of the upper secondary latch (block 830).

A triple-inverted clock signal is received on a gate of a P-type transistor of a first stack of the lower secondary latch (block 835). The double-inverted clock signal is also received on a gate of an N-type transistor of the first stack of the lower secondary latch (block 840). The double-inverted clock signal is also received on a gate of a P-type transistor of a second stack of the lower secondary latch (block 845). The triple-inverted clock signal is also received on a gate of an N-type transistor of the second stack of the lower secondary latch (block 850). A signal generated by the second stack of the upper secondary latch is inverted twice on an upper secondary latch signal path (block 855). A signal generated by the second stack of the lower secondary latch is inverted once on a lower secondary latch signal path (block 860). An output signal is generated based on a reconvergence of the upper secondary latch signal path with the lower secondary latch signal path (block 865). After block 865, method 800 ends. A low-power clock-to-Q delay balanced flip-flop can be implemented by performing method 800.

Referring now to FIG. 9, one embodiment of a method 900 for implementing a primary latch portion of a flip-flop with a balanced clock-to-Q delay is shown. An input signal is received on gates of a P-type transistor and an N-type transistor of a first stack of a primary latch of a flip-flop with a balanced clock-to-Q delay (block 905). A double-inverted clock signal is received on a gate of a P-type transistor of a first stack of the primary latch (block 910). A triple-inverted clock signal is received on a gate of an N-type transistor of the first stack of the primary latch (block 915). The triple-inverted clock signal is also received by a gate of a P-type transistor of a second stack of the primary latch (block 920). The double-inverted clock signal is also received on a gate of an N-type transistor of the second stack of the primary latch (block 925). A signal generated at a mid-point of the first and second stacks of the primary latch is received by an inverter (block 930). The output of the inverter is received by an upper secondary latch and a lower secondary latch (block 935). After block 935, method 900 ends.

Figure 10:
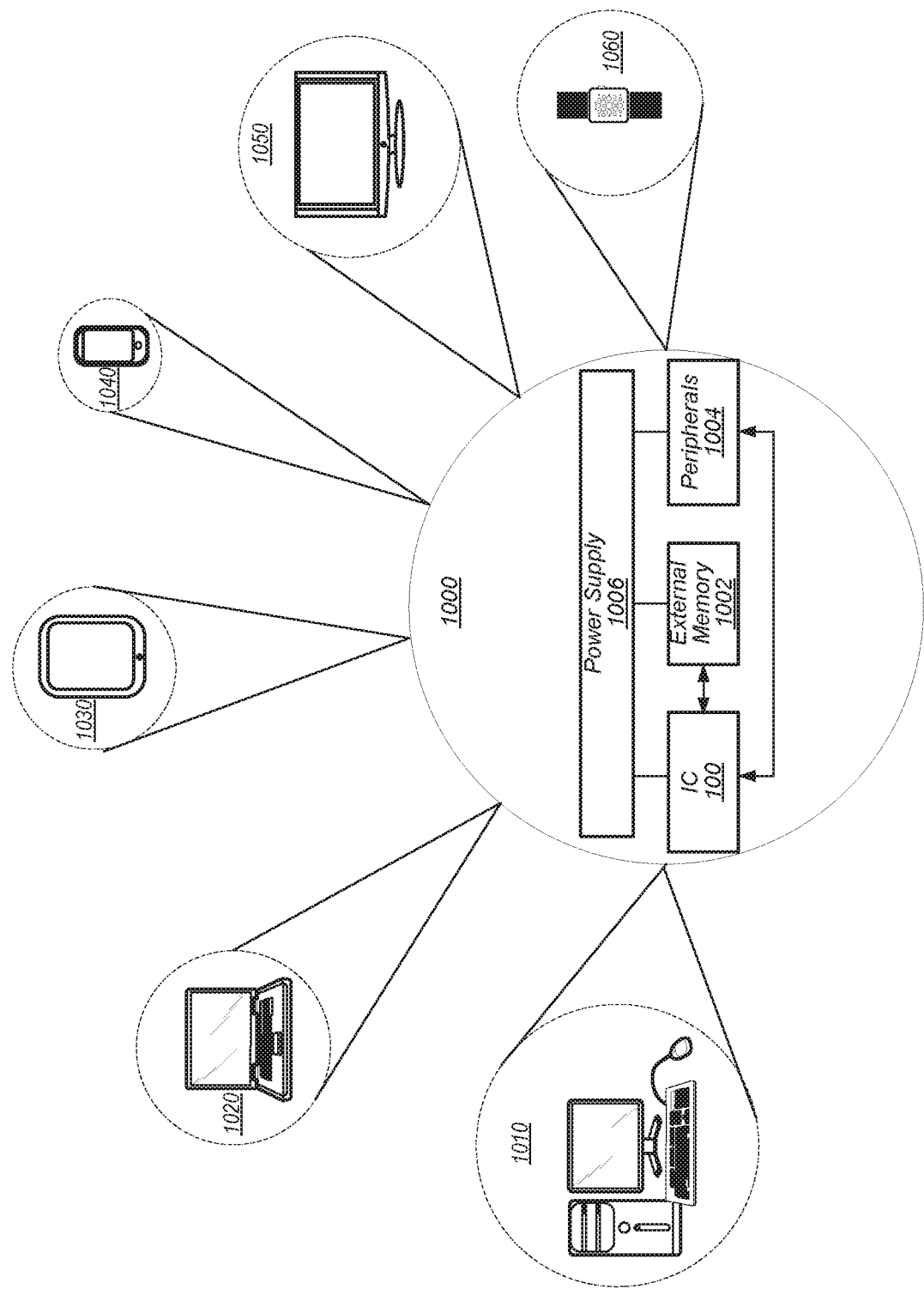
FIG. 10 is a block diagram of one embodiment of a system.

Turning now to FIG. 10, a block diagram of one embodiment of a system 1000 is shown. As shown, system 1000 may represent chip, circuitry, components, etc., of a desktop computer 1010, laptop computer 1020, tablet computer 1030, cell or mobile phone 1040, television 1050 (or set top box configured to be coupled to a television), wrist watch or other wearable item 1060, or otherwise. Other devices are possible and are contemplated. In the illustrated embodiment, the system 1000 includes at least one instance of integrated circuit (IC) 100 (of FIG. 1) coupled to one or more peripherals 1004 and the external memory 1002. A power supply 1006 is also provided which supplies the supply voltages to IC 100 as well as one or more supply voltages to the memory 1002 and/or the peripherals 1004. In various embodiments, power supply 1006 may represent a battery (e.g., a rechargeable battery in a smart phone, laptop or tablet computer). In some embodiments, more than one instance of IC 100 may be included (and more than one external memory 1002 may be included as well).

The memory 1002 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with IC 100 in a chip-on-chip configuration, a package-on-package configuration, or a multi-chip module configuration.

The peripherals 1004 may include any desired circuitry, depending on the type of system 1000. For example, in one embodiment, peripherals 1004 may include devices for various types of wireless communication, such as wifi, Bluetooth, cellular, global positioning system, etc. The peripherals 1004 may also include additional storage, including RAM storage, solid state storage, or disk storage. The peripherals 1004 may include user interface devices such as a display screen, including touch display screens or multitouch display screens, keyboard or other input devices, microphones, speakers, etc.

Figure 11:
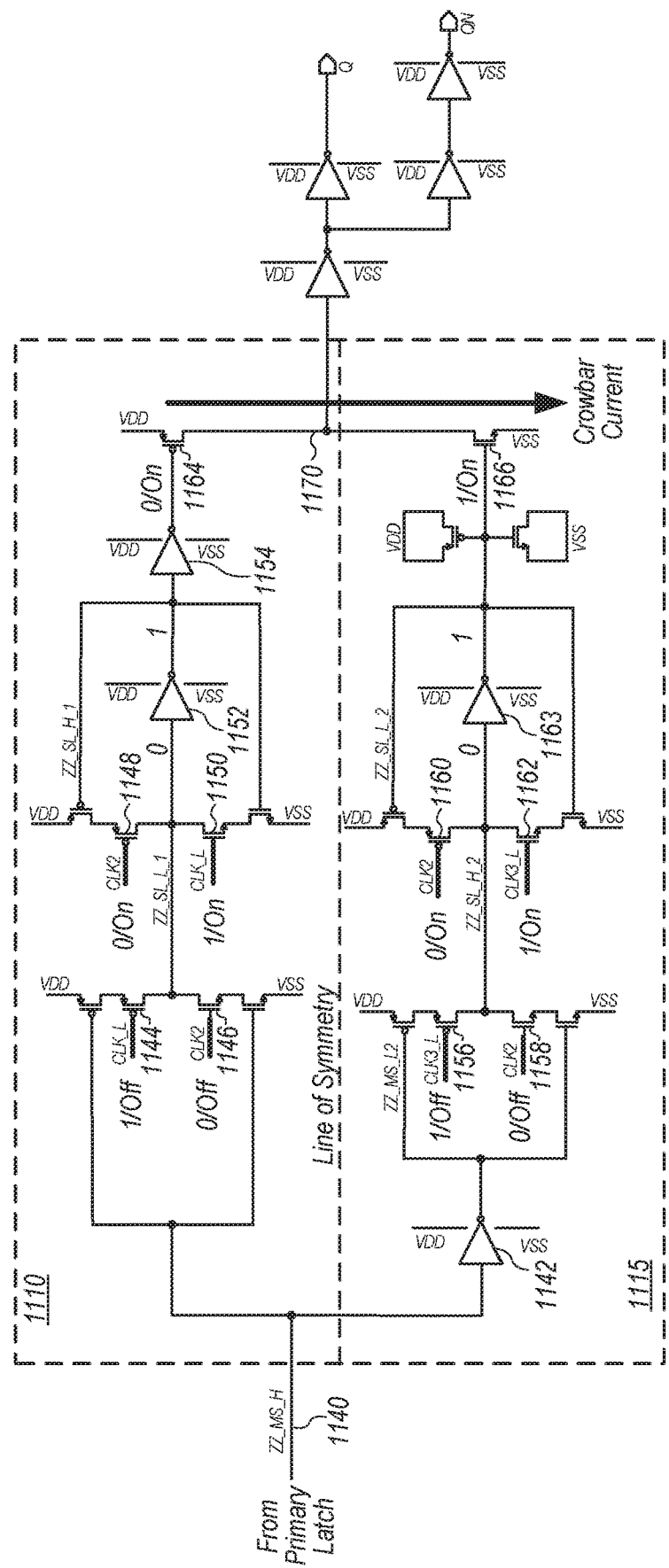
FIG. 11 is a circuit diagram illustrating one embodiment of a portion of a flip-flop with a crowbar circuit on power-up.

Referring now to FIG. 11, a circuit diagram of one embodiment of a portion of a flip-flop with a crowbar current on power-up is shown. The portion of the flip-flop shown in FIG. 11 is similar to the flip-flop 200 (of FIG. 2) while omitting the inverter (i.e., inverter 272) in between the lower secondary latch and upper secondary latch. While upper secondary latch 1110 and lower secondary latch 1115 are shown in FIG. 11, the primary secondary latch portion of the flip-flop is not shown to avoid cluttering the figure. The input signal "ZZ_MS_H" (or signal 1140) is received by upper secondary latch 1110 and by inverter 1142 of lower secondary latch 1115 from the primary secondary latch. In flip-flop 200, inverter 272 in between lower secondary latch 215 and upper secondary latch 210 prevents the crowbar circuit on power-up. In contrast, FIG. 11 illustrates an upper secondary latch 1110 and lower secondary latch 1115 which do not have this inverter and which consequently suffer from the crowbar circuit on power-up.

Example logic values for different circuit points are shown in FIG. 11. For example, the "CLK_L" input to the gate of P-type transistor 1144 is 1 on power-up, causing P-type transistor 1144 to be off. Also, the "CLK2" input to the gate of N-type transistor 1146 is 0 on power-up, causing N-type transistor 1146 to be off. Similarly, P-type transistor 1156 and N-type transistor 1158 of lower slate latch 1115 are off at power-up based on the state of the clock signals coupled to their gates. It is noted that it is assumed for the purposes of this discussion that the clock signal "CLK" is low on power-up.

Also as shown in FIG. 11, transistors 1148 and 1150 are on and the input to inverter 1152 is 0, causing the output of inverter 1152 to be 1 of upper secondary latch 1110. This causes the output of inverter 1154 to be 0, and since the output of inverter 1154 is coupled to the gate of P-type transistor 1164, P-type transistor 1164 will be on. For lower secondary latch 1115, transistors 1160 and 1162 are on based on their respective clock signals. Also, an input of 0 to inverter 1163 causes the output of inverter 1163 to be 1 which turns on N-type transistor 1166. This causes a crowbar current to flow through both P-type transistor 1164 and N-type transistor 1166. This is the scenario that is prevented by using an inverter (e.g., inverter 272) to make sure only one of the transistors coupled to the prebuffered data output (i.e., node 1170) is on at start-up. In other embodiments, other techniques for preventing the crowbar current can be used by a flip-flop circuit.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A circuit comprising:
    a primary latch configured to transmit a data value from an input port to a first node when the primary latch is transparent;
    a first secondary latch configured to pull-up a second node when the first secondary latch is transparent and the first node is equal to a first value; and
    a second secondary latch configured to pull-down the second node when the second secondary latch is transparent and the first node is equal to a second value different from the first value;
    wherein a first set of clock signals are coupled to the primary latch and a second set of clock signals are coupled to the first secondary latch, wherein the first set of clock signals are delayed with respect to the second set of clock signals.

2. The circuit as recited in claim 1, wherein the circuit further comprises:
    a pair of inverters to buffer an internal node of the first secondary latch; and
    a single inverter, different from the pair of inverters, to buffer an internal node of the second secondary latch.

3. The circuit as recited in claim 1, wherein the first set of clock signals are coupled to transistor gates of the primary latch and the second set of clock signals are coupled to transistor gates of the first secondary latch.

4. The circuit as recited in claim 1, wherein the circuit is configured to:
    receive a single-inverted clock signal and a double-inverted clock signal on transistor gates of first and second stacks of the first secondary latch;
    receive the double-inverted clock signal and a triple-inverted clock signal on transistor gates of first and second stacks of the second secondary latch; and
    generate an output value by reconverging a first secondary latch signal path with a second secondary latch signal path.

5. The circuit as recited in claim 1, wherein the circuit is configured to:
    receive a single-inverted clock signal on a gate of a P-type transistor of a first stack of the first secondary latch; and
    receive a double-inverted clock signal on a gate of an N-type transistor of the first stack of the first secondary latch.

6. The circuit as recited in claim 5, wherein the circuit is configured to:
    receive a double-inverted clock signal on a gate of a P-type transistor of a second stack of the first secondary latch; and
    receive a single-inverted clock signal on a gate of an N-type transistor of the second stack of the first secondary latch.

7. The circuit as recited in claim 6, wherein the circuit is configured to:
    receive a triple-inverted clock signal on a gate of a P-type transistor of a first stack of the second secondary latch; and
    receive a double-inverted clock signal on a gate of an N-type transistor of the first stack of the second secondary latch.

8. A method comprising:
    transmitting, by a primary latch, a data value from an input port to a first node when the primary latch is transparent;
    pulling up, by a first secondary latch, a second node when the first secondary latch is transparent and the first node is equal to a first value; and
    pulling down, by a second secondary latch, the second node when the second secondary latch is transparent and the first node is equal to a second value different from the first value;
    wherein a first set of clock signals are coupled to the primary latch and a second set of clock signals are coupled to the first secondary latch, wherein the first set of clock signals are delayed with respect to the second set of clock signals.

9. The method as recited in claim 8, further comprising:
    buffering, by a pair of inverters, an internal node of the first secondary latch; and
    buffering, by a single inverter different from the pair of inverters, an internal node of the second secondary latch.

10. The method as recited in claim 8, wherein the first set of clock signals are coupled to transistor gates of the primary latch and the second set of clock signals are coupled to transistor gates of the first secondary latch.

11. The method as recited in claim 8, further comprising:
    receiving a single-inverted clock signal and a double-inverted clock signal on transistor gates of first and second stacks of the first secondary latch;
    receiving the double-inverted clock signal and a triple-inverted clock signal on transistor gates of first and second stacks of the second secondary latch; and
    generating an output value by reconverging a first secondary latch signal path with a second secondary latch signal path.

12. The method as recited in claim 8, further comprising:
receiving a single-inverted clock signal on a gate of a P-type transistor of a first stack of the first secondary latch; and
receiving a double-inverted clock signal on a gate of an N-type transistor of the first stack of the first secondary latch.

13. The method as recited in claim 12, further comprising:
receiving a double-inverted clock signal on a gate of a P-type transistor of a second stack of the first secondary latch; and
receiving a single-inverted clock signal on a gate of an N-type transistor of the second stack of the first secondary latch.

14. The method as recited in claim 13, further comprising:
receiving a triple-inverted clock signal on a gate of a P-type transistor of a first stack of the second secondary latch; and
receiving a double-inverted clock signal on a gate of an N-type transistor of the first stack of the second secondary latch.

15. A system comprising:
a first secondary latch configured to pull-up a node when the first secondary latch is transparent and an output of a primary latch is a first value; and
a second secondary latch configured to pull-down the node when the second secondary latch is transparent and the output of the primary latch is a second value different from the first value;
wherein a first set of clock signals are coupled to the primary latch and a second set of clock signals are coupled to the first secondary latch, wherein the first set of clock signals are delayed with respect to the second set of clock signals.

16. The system as recited in claim 15, wherein the system further comprises:
a pair of inverters to buffer an internal node of the first secondary latch; and
a single inverter, different from the pair of inverters, to buffer an internal node of the second secondary latch.

17. The system as recited in claim 15, wherein the first set of clock signals are coupled to transistor gates of the primary latch and the second set of clock signals are coupled to transistor gates of the first secondary latch.

18. The system as recited in claim 15, wherein the first secondary latch is configured to:
receive a single-inverted clock signal on a gate of a P-type transistor of a first stack; and
receive a double-inverted clock signal on a gate of an N-type transistor of the first stack.

19. The system as recited in claim 18, wherein the first secondary latch is configured to:
receive a double-inverted clock signal on a gate of a P-type transistor of a second stack; and
receive a single-inverted clock signal on a gate of an N-type transistor of the second stack.

20. The system as recited in claim 19, wherein the second secondary latch is configured to:
receive a triple-inverted clock signal on a gate of a P-type transistor of a first stack; and
receive a double-inverted clock signal on a gate of an N-type transistor of the first stack.

* * * * *